(12) United States Patent
Akram

(10) Patent No.: US 6,295,730 B1
(45) Date of Patent: Oct. 2, 2001

(54) METHOD AND APPARATUS FOR FORMING METAL CONTACTS ON A SUBSTRATE

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/389,316

(22) Filed: Sep. 2, 1999

(51) Int. Cl.$^7$ .................................................. H01R 9/00
(52) U.S. Cl. ............................. 29/843; 29/825; 29/846; 228/56.3; 228/180.22; 228/254; 257/777
(58) Field of Search ........................... 29/846, 825, 843; 228/254, 180.22, 56.3; 257/777

(56) References Cited

U.S. PATENT DOCUMENTS

| | | |
|---|---|---|
| 4,125,441 | 11/1978 | Dugan . |
| 4,141,782 | 2/1979 | Dugan et al. . |
| 4,649,415 | 3/1987 | Hebert . |
| 4,807,021 * | 2/1989 | Okumura . |
| 4,906,823 * | 3/1990 | Kushima et al. . |
| 4,967,261 | 10/1990 | Niki et al. . |
| 5,045,657 | 9/1991 | Iyer et al. . |
| 5,371,406 | 12/1994 | Kojima et al. . |
| 5,491,415 | 2/1996 | Holmes et al. . |
| 5,607,099 * | 3/1997 | Yeh et al. . |
| 5,643,831 * | 7/1997 | Achiai et al. . |
| 5,775,569 * | 7/1998 | Berger et al. . |
| 6,003,757 * | 12/1999 | Beaumont et al. . |

\* cited by examiner

*Primary Examiner*—Carl J. Arbes
(74) *Attorney, Agent, or Firm*—TraskBritt

(57) ABSTRACT

Metal traces and solder bump pads are formed on a semiconductor substrate by way of a semiconductor template that has been micro-machined to receive solder paste material. The solder paste material is then formed into precisely-controlled ball shapes and metal trace geometries. First, a semiconductor substrate is covered with a mask material for protecting selected surfaces of the substrate that are not to be etched. Next, a mask is applied in order to etch the substrate surface below. Solder ball sites and metal trace channels are formed at this time. A solder non-wettable material is applied to the exposed surfaces of the solder ball sites and the metal trace channels. A solder paste can then be applied uniformly across the surface of the substrate, thus filling in any sites and channels, or both, that are used to form the balls in metal traces desired. The semiconductor template is then applied solder side to a second substrate so that the solder balls and traces can be applied directly on the second substrate using heat to reflow the solder to the second substrate.

23 Claims, 8 Drawing Sheets

METHOD AND APPARATUS FOR FORMING METAL CONTACTS ON A SUBSTRATE

BACKGROUND OF THE INVENTION

The present invention relates generally to forming contacts on a semiconductor substrate and, more specifically, to the formation of metal bump contacts or connectors on a semiconductor substrate using micro-machining techniques.

Recent advances in data processing devices and memory circuits have resulted in the implementation of very large scale integrated circuits (VLSI) and even ultra large scale integrated circuits (ULSI). These VLSI and ULSI circuits are fabricated on semiconductor chips that include integrated circuits and other electrical parts. In order to mount a semiconductor chip to a carrier substrate, such as a printed circuit board or a ceramic substrate, solder bumps are arranged onto one of the semiconductor chip and the carrier substrate so that the semiconductor chip can be mechanically and electrically connected via metallurgical processes by melting the solder bumps.

One approach to applying and forming solder bumps and a carrier substrate is to use a solder paste. The solder paste is printed onto the carrier substrate and leads extending from the semiconductor chip are placed on the solder paste on the carrier substrate. The structure is then heated to cause the solder in the solder paste to melt so that the semiconductor chip can be mechanically and electrically connected to the carrier substrate. To place the solder paste onto the carrier substrate, a metal mask with predetermined openings is typically used. The solder paste is applied to the surface of the metal mask and a wiper is moved across the surface of the mask, thus pushing the solder paste through the openings of the metal mask onto the surface of the carrier substrate. Such masks are typically referred to as stencils.

Unfortunately, as the critical dimensions of the integrated circuits become smaller and smaller, the amount of solder paste that can be pressed through a given stencil becomes smaller and the placement of the solder paste becomes even more difficult. Additionally, with the smaller critical dimensions, the stencil mask becomes even more difficult to clean for a subsequent solder paste application as well as being subject to high rates of wear because of the constant placement of the stenoid, application of the paste to the stencil, and removal, and cleaning of the stencil.

Another method of placing conductive contacts for connecting the semiconductor chip to the carrier substrate has been to use preformed solder balls that are placed directly upon either the carrier substrate or the semiconductor chip with precisely controlled placement. Once the solder balls are in place, the solder balls are subjected to heat to cause a partial reflow so that the solder balls adhere to the solder pad. Unfortunately, in this process, as the critical dimensions of the features on the semiconductor chip tend to decrease, significant disadvantages become apparent in using this type of technique. One disadvantage is that the processing costs due to the limited process reliability and the speed of the pick and place nature of the transfer process become more evident. Another disadvantage is that the physical handling and placement of the solder balls by the machine dictates the minimum spacing allowed between solder bumps on a semiconductor chip or carrier substrate, and thus requires a semiconductor chip that would be larger than otherwise necessary for the desired VLSI or ULSI circuitry.

Additional problems involve the uniformity of the preformed solder balls. At smaller and smaller ball sizes, the average diameter of the preformed solder balls may vary greatly from the desired diameter of the preformed solder ball. This wide discrepancy in uniformity can lead to several problems. Preformed solder balls not only cannot be applied where desired, but when a too large or to small preformed solder ball is placed upon a pad, after the formation of a connection using such a performed solder ball, typically the location will be noted as either having several bad connections surrounding a ball that is too large or having a defective connection where the ball is too small. Large diameter preformed solder balls tend to prevent adjacent acceptable preformed solder balls from mechanically and electrically connecting between the carrier substrate and the semiconductor chip. Small diameter preformed solder balls are not large enough in diameter than the smaller ball, which can only touch one of the two surfaces.

Yet another technique has been developed that uses a method for forming solder balls on a semiconductor plate having apertures. One such technique is described in U.S. Pat. No. 5,643,831, entitled "Process for Forming Solder Balls on a Plate Having Apertures Using Solder Paste and Transferring the Solder Ball to Semiconductor Device", issued Jul. 1, 1997. The '831 Patent discloses a method for fabricating a semiconductor device using a solder ball forming plate having cavities. Solder paste is placed in the cavities using a solder paste application, such as a squeegee. Once the cavities are filled with solder paste, the solder ball forming plate is heated to form solder balls in the cavities while the plate is in an inclined position. The solder balls are then transferred from the plate to a semiconductor chip.

The solder ball forming plate is fabricated from a semiconductor material such as silicon, according to the following method. Initially, a substantially uniform flat surface is formed on the plate. Next, a plurality of cavities is formed in the flat surface of the plate. The cavities are formed by etching the semiconductor materials after a mask has been formed on the flat surface, each cavity having the shape of a precisely formed rhombus or parallelogram.

Yet another example of using a solder ball forming plate is disclosed in U.S. Pat. No. 5,607,099, entitled "Solder Bump Transfer Device for Flip-Chip Integrated Circuit Devices", issued Mar. 4, 1997. The '099 Patent discloses a carrier device that has cavities formed in its surface for receiving and retaining solder material. The solder material can then be transferred to a flip-chip as solder bumps. The cavities are located on the surface of the carrier device such that the location of the solder material corresponds to the desired solder bump locations on the flip-chip when the carrier device is placed in alignment with the flip chip. The size of the cavities can be controlled in order to deliver a precise quantity of solder material to the flip-chip. Further, in the '099 Patent, the apertures are fabricated so that they have a width of about 300 $\mu$m at the surface of the die and a width of about 125 $\mu$m at its base surface. Meanwhile, in the '831 Patent, the rhombus shaped cavities are design to produce a ball size of about 100 $\mu$m in diameter. Unfortunately, both of these structures cannot yet produce a ball size for a solder ball that approaches the dimensions currently required in placing a semiconductor chip upon a carrier substrate using the flip-chip technology. Additionally, the solder ball forming cavities are limited in shape.

Accordingly, it would be advantageous to overcome the problems of producing and using solder balls having uniform sizes as have been shown in the prior art approaches of utilizing preformed solder balls or to use metal masks or stencils to apply solder paste for reflow into solder balls. Additionally, it would be advantageous to make even smaller, more precisely formed solder balls than is possible in the prior art as well as to fabricate metal traces during the same step as that of forming solder balls using a solder ball forming plate.

Not only would it be advantageous to overcome the problems of producing uniform solder ball sizes for use in connecting a device to a substrate, but it would also be beneficial to provide a way of greatly improving the precision with which solder connections are made in alignment.

BRIEF SUMMARY OF THE INVENTION

According to the present invention, metal traces and solder bump pads are formed on a semiconductor substrate by way of a semiconductor template that has been micromachined to receive solder paste material. The solder paste material is then formed into precisely-controlled ball-shapes and metal trace geometries. First, a semiconductor substrate is covered with a mask material for protecting selected surfaces of the substrate that are not to be etched. Next, a mask is applied in order to anisotropically etch the substrate surface below. Solder ball sites and metal trace channels are formed at this time. A solder non-wettable material is applied to the exposed surfaces of the solder ball sites and the metal trace channels. A solder paste can then be applied uniformly across the surface of the substrate, thus filling in any sites and channels, or both, that are used to form the desired balls. The semiconductor template is then applied solder side to a second substrate so that the solder balls and traces can be applied directly on the second substrate, the solder balls being subsequently formed on the second substrate by the heating thereof to form the solder paste into a solder ball.

DETAILED DESCRIPTION OF THE INVENTION

Illustrated in drawings FIGS. 1A–1D is a method for fabricating the semiconductor substrate to form metal bumps or metal traces, or both, on the surface of a secondary substrate. A semiconductor substrate, typically a flat planar substrate having a flat planar upper surface, a flat planar lower surface, and a plurality of planar sides forming the periphery of the substrate, is selected to serve as a bump forming substrate mold 10. The semiconductor substrate may be of any desired size and geometric shape suitable for use with an associated semiconductor device. The semiconductor substrate is selected from a semiconductor base material such as silicon, gallium arsenide, silicon on insulator, which may include silicon on glass or sapphire, or other well-known semiconductor substrate materials, as well as other similar types of materials, which are capable of being precisely micro-machined and having a coefficient of thermal expansion (CTE) similar to that of the semiconductor materials. In this particular application, it is preferred that a silicon substrate is used for substrate mold 10, although any of the other base materials may be freely substituted therefor. The silicon substrate is aligned such that the flat, planar upper surface 12 of substrate mold 10 defines the <100> plane of the substrate mold 10 which mates with a semiconductor device (not shown). As is shown in drawing FIG. 1A, a flat, planar upper surface 12 of substrate mold 10 has a first protective mask layer 14 located thereon. The first protective mask layer 14 may be selected from particular etch resistant materials such as nitride, oxide, or a hardened polymer spin-on mask. Substrate mold 10 typically has a thickness of about 25 to 28 mils.

Figure 1A:
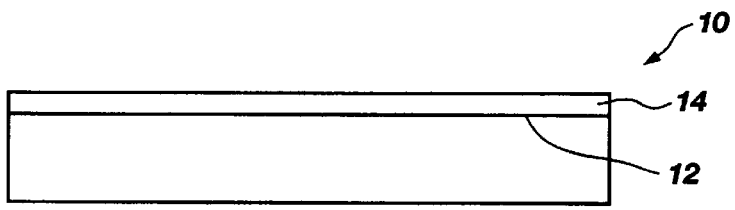
FIGS. 1A–D illustrate a cross-sectional view of steps used in forming solder receiving holes and channels in a substrate mold according to the present invention.
Figure 1B:
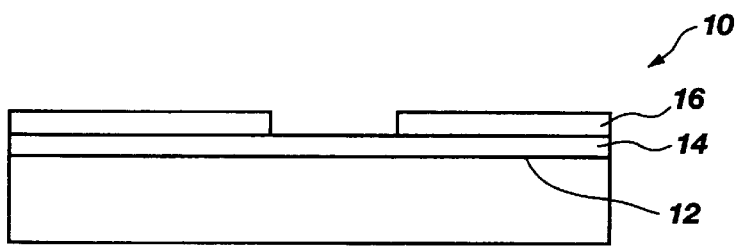
Figure 1C:
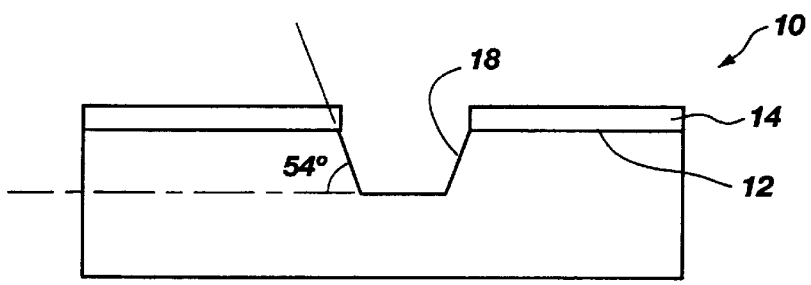
Figure 1D:
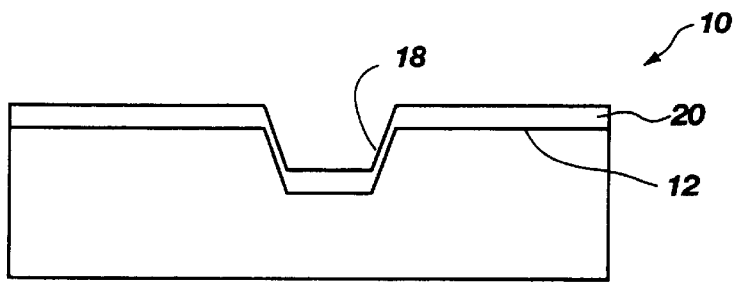

Next, in drawing FIG. 1B, a photoresist 16 is applied over the surface of mask layer 14 and then exposed through a mask to define openings exposing the selected cavity locations to be formed in flat, planar upper surface 12. Then, as shown in FIG. 1C, a sufficient amout of semiconductor material is removed by an anisotropic etching from the exposed portion of the flat, planar surface 12 after penetration of the exposed portion of first protective mask layer 14, thereby forming at least one cavity 18. Using an anisotropic etching process, the cavity 18 has walls sloped at 54° relative to the <100> plane of the substrate mold 10. The anisotropic etchant may be, for example, KOH, or other etchant materials well known to those skilled in the art. Further, if straight walls are desired, a dry etching using a plasma etch apparatus may be used to form cavity 18.

After the formation of cavity 18, first protective mask layer 14 is removed using a dry-etch process that is selective to removing first protective mask layer 14 only and not removing any of the underlying silicon either in the cavity 18 thus formed or on the flat, planar upper surface 12 of substrate mold 10. For example, if first protective mask layer 14 is silicon dioxide, a removal substance such as phosphoric acid may be used. After the removal of the first protective mask layer 14, a release layer 20 is formed over the entire flat, planar upper surface 12 of substrate mold 10, particularly covering cavity 18. Release layer 20 is selected from a material that is relatively non-wettable to metal solder. Such materials include silicon dioxide or silicon nitride, which can be applied using a chemical vapor deposition process. Other materials that are relatively non-wettable to metal solder may also be used, such as, for example, non-wettable polymers or the like. The result in structure is depicted in drawing FIG. 1D.

Figure 2:
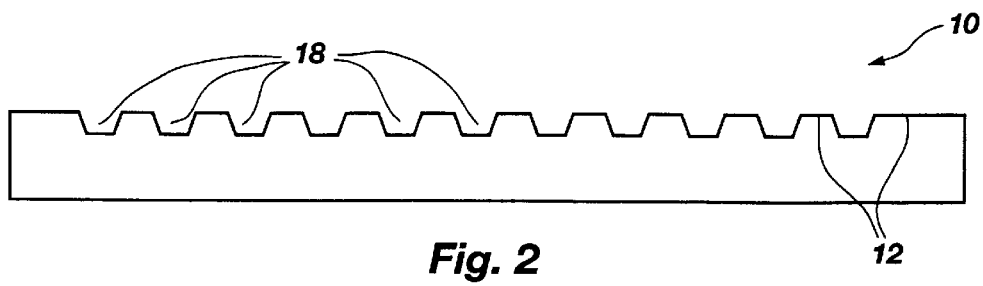
FIG. 2 depicts a surface of the substrate mold having a plurality of cavities formed therein.

Although drawing FIGS. 1A–D illustrated only a single cavity 18, it is intended that a plurality of cavities be formed in an array across substrate mold 10. An example of a solder ball forming mold or substrate mold 10 that has such a plurality of cavities 18 is depicted in drawing FIG. 2. Release layer 20 is applied and utilized to minimize the wetting of solder paste on the substrate mold 10 when the assembly is heated in order to transfer the solder onto the bumps of the secondary surface.

Figure 3:
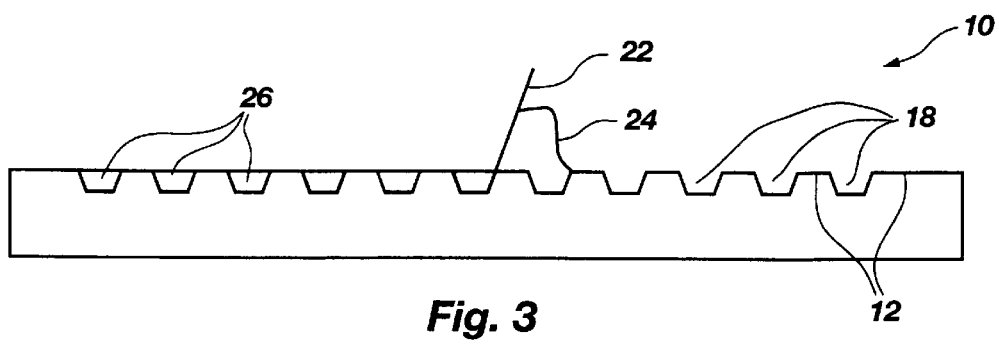
FIG. 3 illustrates the application of solder paste to the cavities and traces of the substrate mold of FIG. 2.

Solder paste is applied, as shown in drawing FIG. 3, by use of an applicator 22, such as a squeegee, that is passed across the surface of substrate mold 10 pressing a metal solder paste 24 into the plurality of cavities 18 and wipes the excess paste away. The solder paste 24 fills cavities 18, thus forming frustroconically-shaped solder bumps 26 (shown in FIGS. 3 and 4).

Various types of metal solder may be used. The most widely employed types include a lead-tin combination. Other types of metal solder may include, but are not limited to, lead-silver, lead-tin-silver, lead-tin—indium, indium-tin, indium-lead, or any paste using copper or gold in combination with the lead or tin. For example, a lead-tin solder paste having a 63/37 weight ratio has a eutectic temperature of 183° C. Another type of lead-tin paste that has a 95/5 weight ratio has a eutectic temperature of about 350° C.

Figure 5:
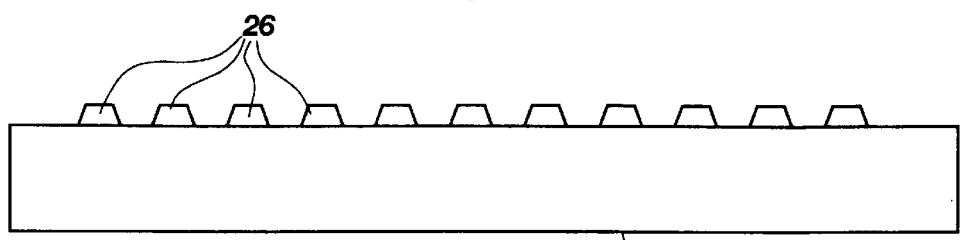
FIG. 5 depicts the second substrate having metal bumps and traces before final reflow.
Figure 6:
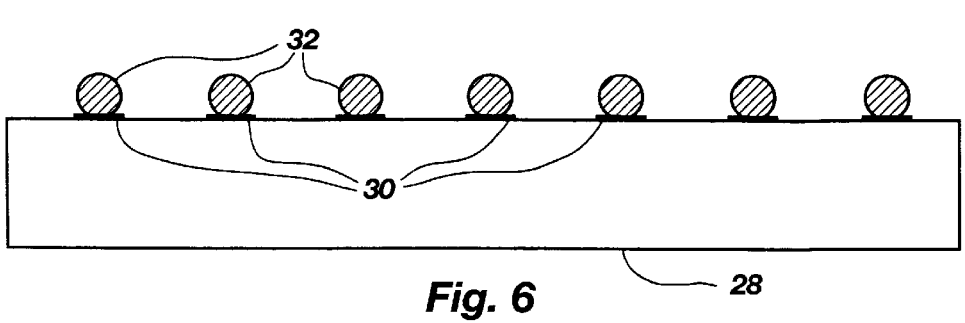
FIG. 6 illustrates the formation of metal balls on the second substrate after reflow.

Once the solder paste 24 is applied to flat, planar upper surface 12 of substrate mold 10, the entire assembly is heated to a temperature sufficient enough to slightly melt the metal solder paste in order to begin the formation of the solder bumps to be transferred. As shown in drawing FIG. 4, after this partially melted solder state has been reached, substrate mold 10 is inverted and applied to the surface of a carrier substrate 28, which may comprise a semiconductor device (die), wafer, or flexible substrate, such as a flex tape. The assembly of the substrate mold 10 and carrier substrate 28 is heated to a sufficiently high enough temperature to cause solder bumps 26 to slightly reflow and release from the release layer 20 formed on substrate mold 10. Substrate mold 10 is then removed and solder bumps 26 adhere to bond pads, terminal pads or other conductive, solder wettable sites 30 on carrier substrate 28, as shown in drawing FIG. 5. Next, an additional reflow step may be performed that causes solder bumps 26 to form into approximately spherically shaped solder balls 32 as attached to conductive solder wettable sites 30 as depicted in drawing FIG. 6.

Because of the generally trapazoidal shape of solder bumps 26, the solder pastes upon heating reflow, draws into a substantially spherical shape and is held together by the surface tension of the solder material to form approximately spherically shaped solder ball 32 or a truncated spherical ball (not shown).

Figure 4:
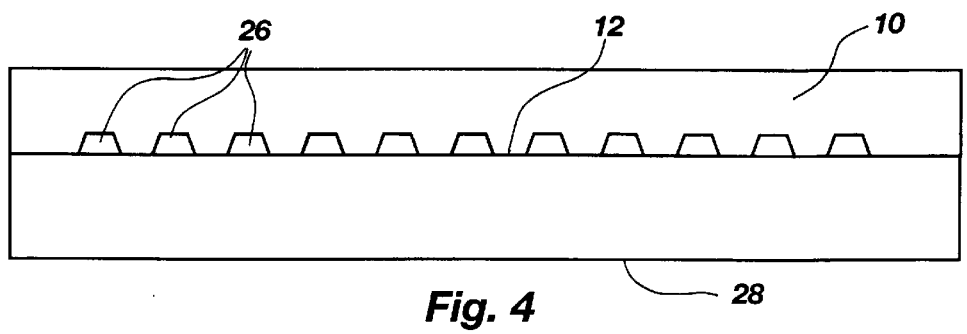
FIG. 4 depicts the formation of solder bumps in the first substrate mold as mated to a second substrate.

Although it has been depicted how solder balls or bumps 32 are formed in drawing FIG. 4, it is also possible to form metal traces using substrate mold 10. The same type of patterning and etch steps as described with respect to FIGS. 1A–1B would be followed, but would include a layout that would form metal traces or channels.

Figure 7:
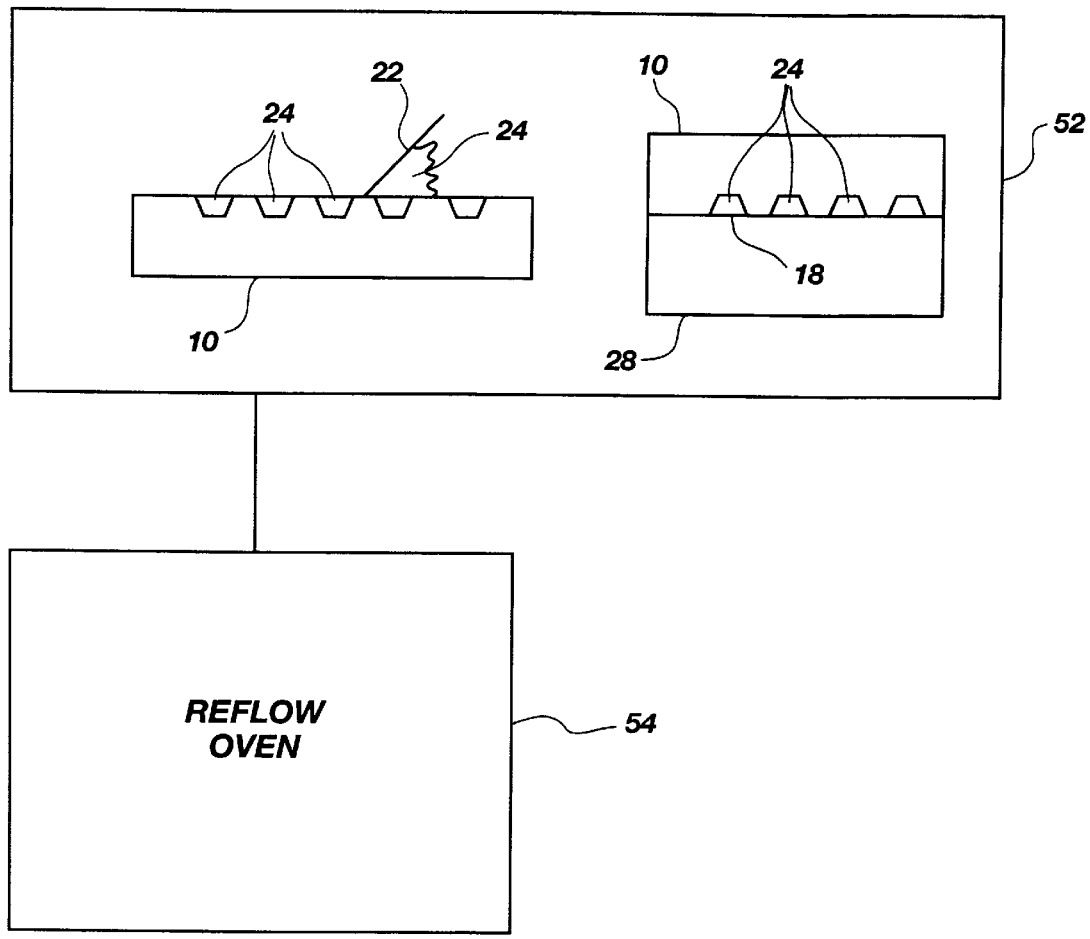
FIG. 7 illustrates a schematic diagram of a mold system using the solder mold according to the present invention.

A solder mold system is depicted in drawing FIG. 7, which incorporates the substrate mold 10 shown in drawing FIGS. 1–6. The mold system includes solder applicator 22 for spreading metal solder paste 24 as dispensed by metal paste dispenser 52. Once the paste is sufficiently in place within the cavities 18, the substrate mold 10 is mated to a secondary substrate as shown in drawing FIG. 4, and then placed in a low-temperature metal paste reflow oven 54 to melt the paste to a sufficient enough consistency to form self-supported bumps and has sufficient enough tackiness to wet the conductive-gates on the carrier substrate 28.

Figure 8:
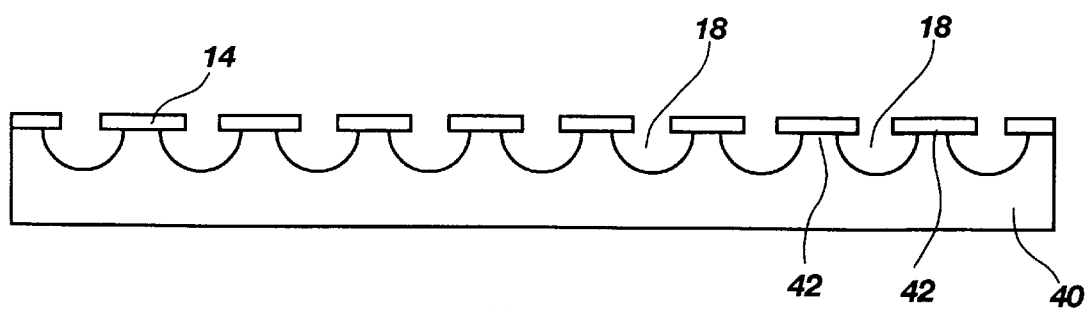
FIG. 8 depicts a surface of a second embodiment of the substrate mold of the present invention having a plurality of hemispherical cross-sectional shaped cavities formed therein prior to the removal of the resist coating on the surface of the substrate mold.

Referring to drawing FIG. 8, an alternative embodiment of a substrate mold 40 of the present invention is illustrated. The substrate mold 40 is similar to the substrate mold 10 described hereinbefore as to construction and methods of construction except that the of cavities 18 formed therein are hemispherically shaped. As illustrated, the first protective mask layer 14 used to form the plurality of cavities 18 is present on portions of the flat, planar upper surface 42 of the substrate mold 40. As with the substrate mold 10, the substrate mold 40 may include a release layer 20 to aid in the release of the solder paste contained within the hemispherical cavities 18.

Figure 9:
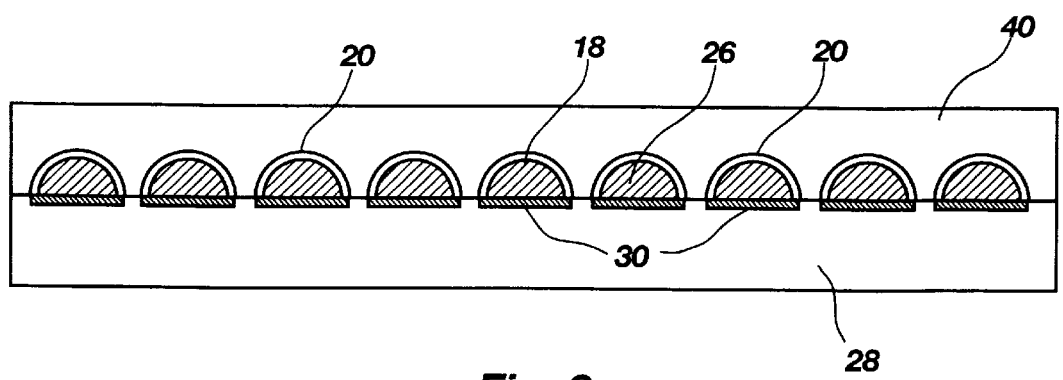
FIG. 9 depicts the substrate mold of FIG. 8 having solder paste in the cavities formed therein in contact with a second substrate.

Referring to drawing FIG. 9, once the solder paste 24 is applied to flat, planar upper surface 42 of substrate mold 40 as described herein with respect to substrate mold 10 illustrated in drawing FIG. 3, the entire assembly of the substrate mold 40 and carrier substrate 28 having conductive sites or bond pads 30 located thereon for the solder paste 24 to be applied is heated to a temperature sufficient enough to slightly melt the metal solder paste 24 in order to begin the formation of the solder bumps be transferred.

Figure 10:
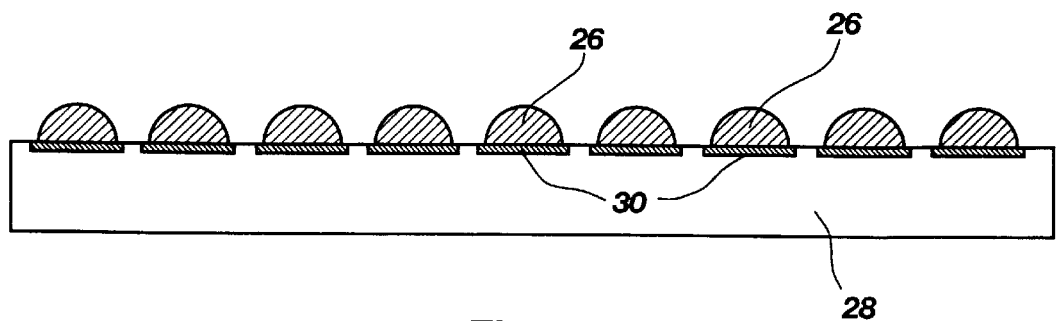
FIG. 10 depicts the second substrate having the solder paste applied thereto after the second embodiment of the substrate mold of the present invention of FIG. 8 is removed.
Figure 11:
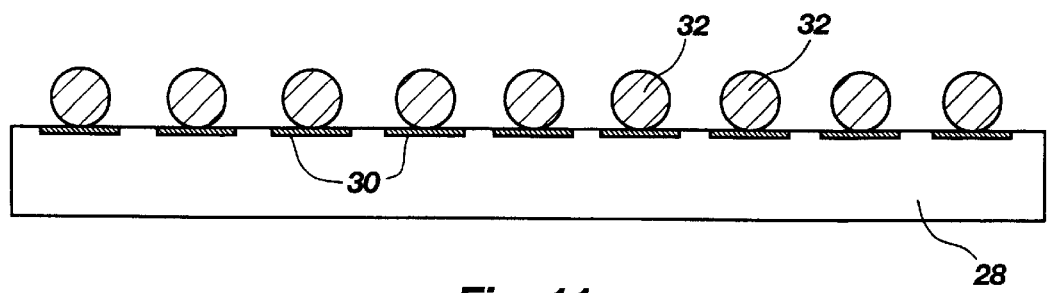
FIG. 11 depicts the second substrate of FIG. 10 after the solder paste has been heated to form solder balls on the second substrate.

As shown in drawing FIG. 9, after this partially melted solder state has been reached, the assembly of the substrate mold 40 and the carrier substrate 28 is inverted so that the solder paste 24 in cavities 18 is applied to the conductive sites 30 on the surface of the carrier substrate 28, which may comprise a semiconductor device (die), wafer, or flexible substrate, such as a flex tape. The assembly of the substrate mold 40 and carrier substrate 28 is heated a sufficiently high enough temperature to cause solder bumps 26 to slightly reflow and release from the release layer 20 formed on substrate mold 40. Substrate mold 40 is then removed and solder bumps 26 adhere to the conductive sites, bond pads, terminal pads or other conductive, solder wettable sites 30 on carrier substrate 28, as shown in drawing FIG. 10. Next, an additional reflow step may be performed that causes solder bumps 26 to form into approximately spherically shaped solder balls 32 as attached to conductive sites 30 as depicted in drawing FIG. 11.

Because of the generally hemispherical shape of solder bumps 26, the solder paste, upon heating reflow, draws into a substantially spherical shape and is held together by the surface tension of the solder material to form approximately spherically shaped solder balls 32 or truncated spheres.

Figure 12:
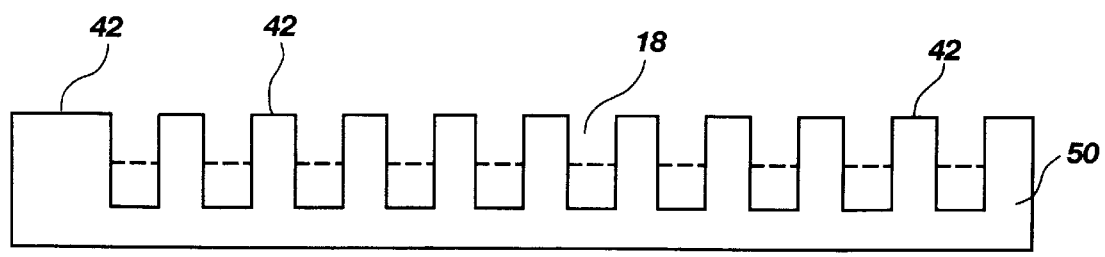
FIG. 12 depicts a surface of a third embodiment of the substrate mold of the present invention having a plurality of rectangular cross-sectional shaped cavities formed therein.

Referring to drawing FIG. 12, an alternative embodiment of a substrate mold 50 of the present invention is illustrated.

The substrate mold 50 is similar to the substrate molds 10 and 40 described hereinbefore as to construction and methods of construction except that the cavities 18 formed therein are generally rectangular, or square shaped (shown in dashed lines). The first protective mask layer 14 used to form the plurality of cavities 18 present on portions of the flat planar upper surface 42 of the substrate mold 50 is not illustrated. As with the substrate mold 10, the substrate mold 50 may include a release layer 20 to aid in the release of the solder paste contained within the hemispherical cavities 18. Referring to drawing FIG. 13, once the solder paste 24 is applied to flat, planar upper surface 42 of substrate mold 50 as described herein with respect to substrate mold 10 illustrated in drawing FIG. 3, the entire assembly of the substrate mold 50 and carrier substrate 28 having conductive sites or bond pads 30 located thereon for the solder paste 24 to be applied is heated to a temperature sufficiently high enough to slightly melt the metal solder paste 18 in order to begin the formation of the solder bumps to be transferred.

Figure 13:
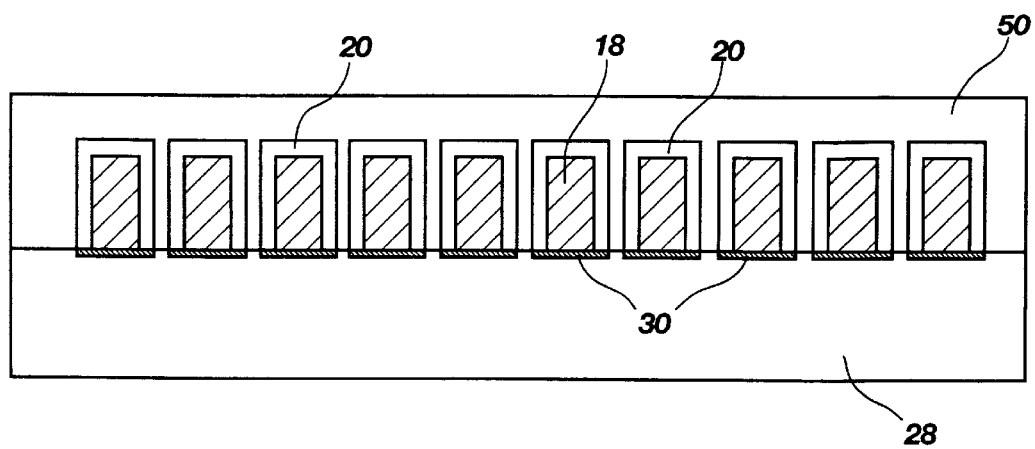
FIG. 13 depicts the substrate mold of FIG. 12 having solder paste in the rectangular cavities in contact with a second substrate.
Figure 14:
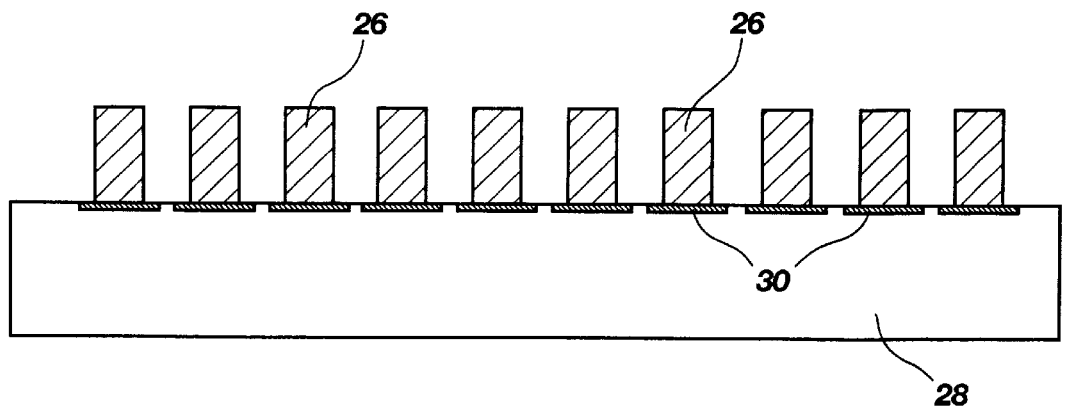
FIG. 14 depicts the second substrate of FIG. 13 having the rectangularly shaped solder paste thereon after having been removed from the substrate of the third embodiment of the invention by the heating thereof.
Figure 15:
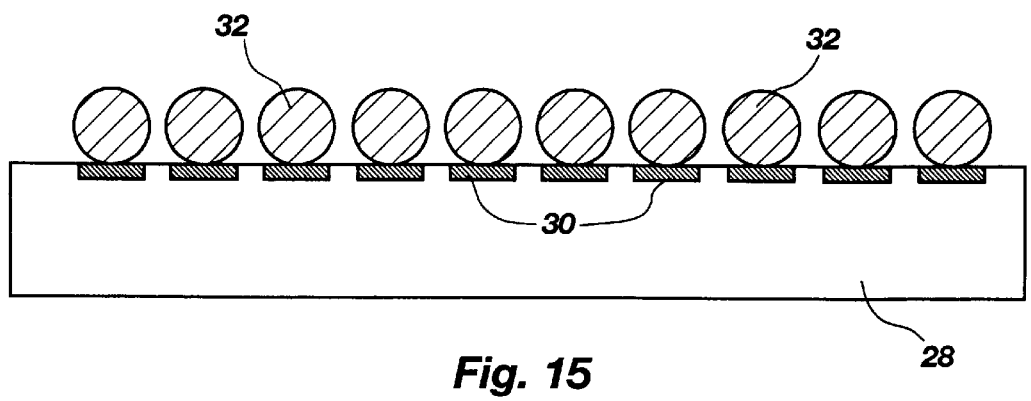
FIG. 15 depicts the second substrate after the heating of the solder paste thereon to form solder balls.

As shown in drawing FIG. 13, after this partially melted solder state has been reached, the assembly of the substrate mold 50 and the carrier substrate 28 is inverted so that the solder paste 24 is applied to the conductive sites 30 on the surface of the a carrier substrate 28, which may comprise a semiconductor device (die), wafer, or flexible substrate, such as a flex tape. The assembly of the substrate mold 50 and carrier substrate 28 is heated to a sufficiently high enough temperature to cause solder bumps 26 to slightly reflow and release from the release layer 20 formed on substrate mold 50. Substrate mold 50 is then removed and solder bumps 26 adhere to the conductive sites, bond pads, terminal pads or other conductive, solder wettable sites 30 on carrier substrate 28, as shown in drawing FIG. 14. Next, an additional reflow step may be performed that causes solder bumps 26 to form into approximate spherically shaped solder balls 32 as attached to conductive sites 30 as depicted in drawing FIG. 15.

Because of the generally rectangular shape of solder bumps 26, the solder paste, upon heating reflow, draws into a substantially spherical shape and is held together by the surface tension of the solder material to form approximately spherically shaped solder balls 32.

Figure 16:
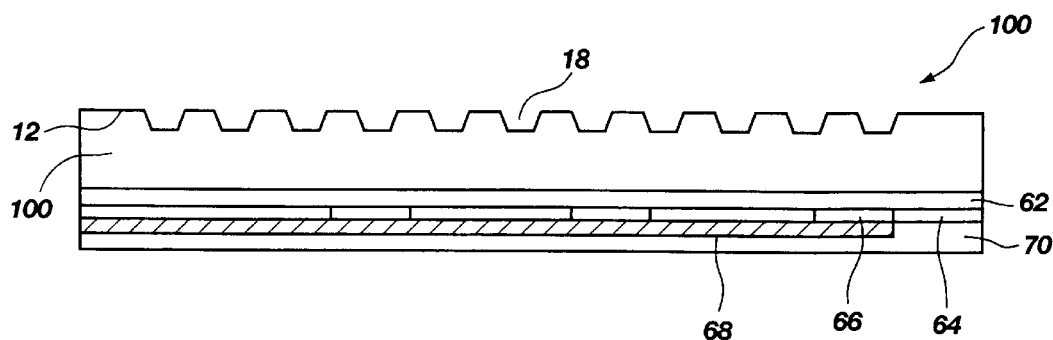
FIG. 16 depicts a fourth embodiment of a substrate mold of the present invention having a plurality of cavities in a surface thereof and a plurality of heating elements on the other surface thereof.

Referring to drawing FIG. 16, another embodiment of the substrate mold 100 of the present invention is illustrated. The substrate mold 100 is similar to the substrate molds 10, 40, and 50 described hereinbefore. The substrate mold 100 includes cavities 18 having any desired shape as described herein in upper flat planar surface 12 and includes electrical resistance heating strips 66 located on the bottom thereof for the heating of the substrate mold 100 with electrical conductor 68 connected thereto. The bottom surface of the substrate mold 100 includes a coating 62 thereon to electrically insulate the heating strips 66 from the substrate mold 100. The heating strips 66 may be of any desired geometrical configuration to cover the bottom surface of the substrate mold 100 to uniformly heat the mold 100 and the solder paste 24 located in the cavities 18 thereof. The electrical conductor 68 may be any desired shape and have any desired location for connection to the heating strips 66. The electrical conductor 68 is covered with an insulation layer 70 located thereover. In areas or portions of the bottom surface of the substrate mold 100 not having a heating strip 66 located thereon, an insulative coating 64 of any suitable type is provided.

Figure 17:
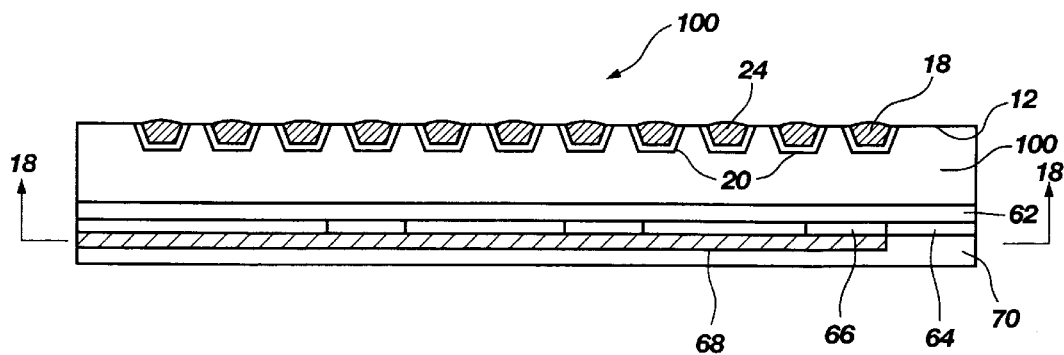
FIG. 17 depicts the substrate of FIG. 16 having solder mold paste in the cavities formed in a surface thereof.

Referring to drawing FIG. 17, the substrate mold 100 is illustrated having solder paste 24 located in cavities 18 having release layer 20 therein. After the solder paste 24 is placed in the cavities 18, a carrier substrate 28 (see FIG. 4) is applied to the substrate mold 100, the assembly of the substrate mold 100 and carrier substrate 28 inverted, and the resistance heating strips 66 on the substrate mold 100 actuated to heat the solder paste 24 to transfer the same to the carrier substrate 28. After the solder paste 24 is transferred to the carrier substrate 28, the substrate 28 is further heated to cause the solder paste to adhere to the conductive sites 30 on the carrier substrate 28 to substantially form solder balls 32 thereon.

Figure 18:
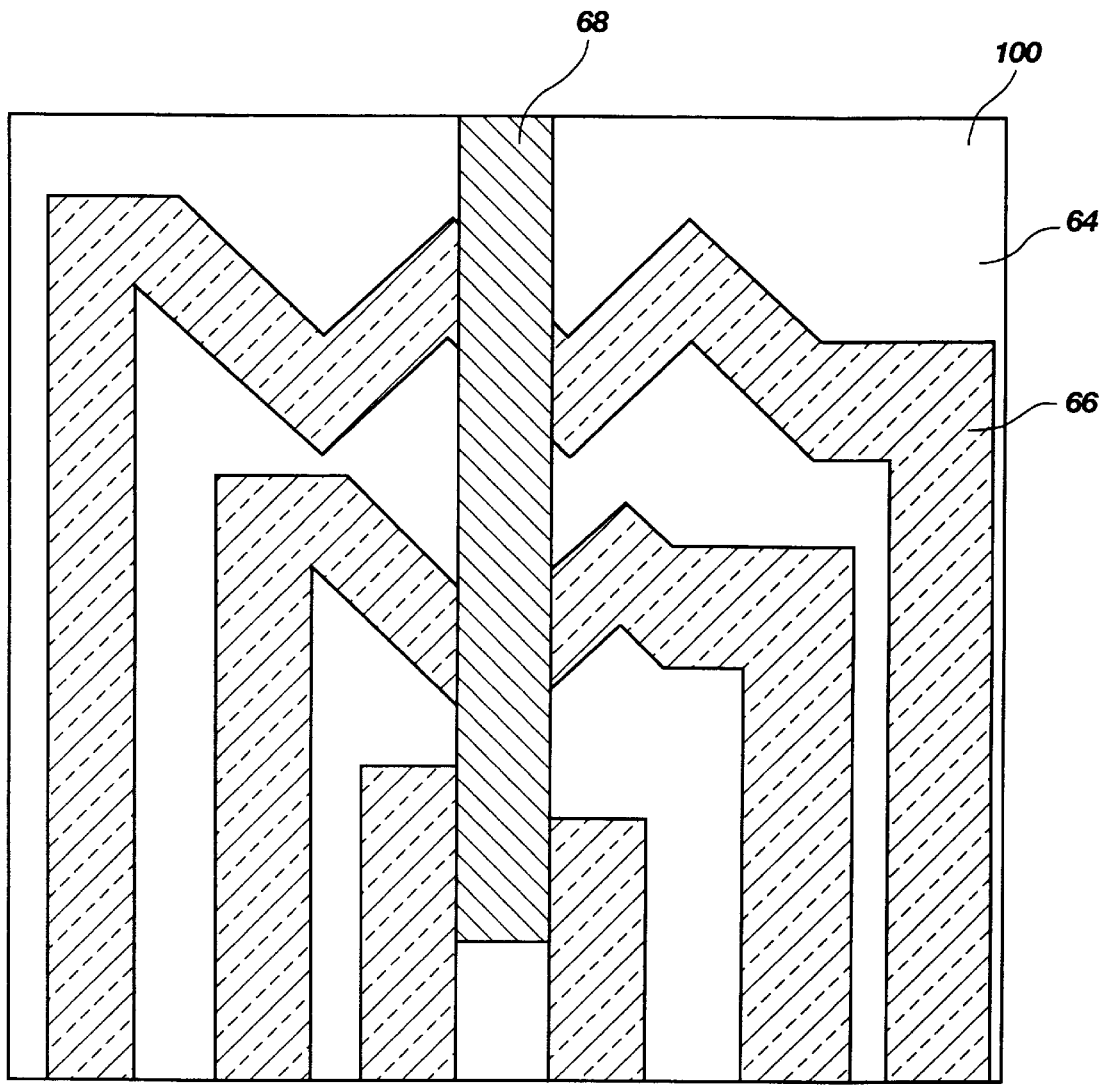
FIG. 18 depicts the other side of the substrate mold of FIG. 16 illustrating the plurality of heating elements thereon along section line 18—18 of drawing FIG. 17.
Figure 7:
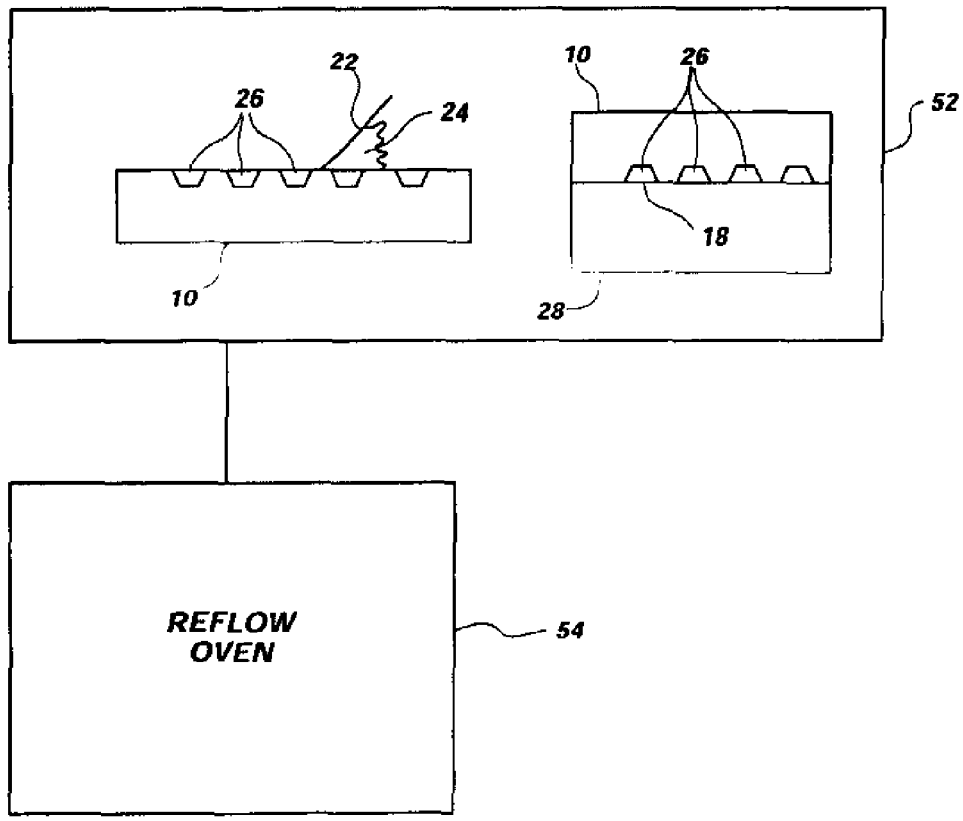

Referring to drawing FIG. 18, the resistance heating strips 66 and conductor 68 are illustrated. The heating strips 66 may be of any desired shape to substantially uniformly heat the substrate mold 100. Similarly, the conductor 68 may be any desired shape to electically connect to the heating strips 66. Further, any desired electrical conductor may be used to electrically connect the connector 68 to a source of electrical power.

Substrate molds 10, 40, 50 and 100 described herein are useful in forming contact bumps for many applications. One application is the formation of flexible connecting tape that requires bumps for interconnection of traces on the tape to a die or other element. The micro-machining of substrate mold 10 provides a much more accurate means for placing the solder ball shaped bumps over the prior art methods of merely placing bumps on top of a screen and then having the screen place the bumps in a proper alignment. Further, the solder ball shaped bumps have a more uniform volume and shape as the cavity dimensions in the semiconductor mold provide a substantially precise control over the formation of the solder ball shaped bumps. By contrast, in the prior art, the uniformity of solder balls has always been a problem, especially at the smaller diameter dimensions that are now being used. Another application for the present invention is for the direct placement of the solder ball shaped bumps on a semiconductor device or die for attachment. Yet another application includes placing the solder ball shaped bumps on a wafer-scale device for interconnection. This allows multiple devices placed on the same substrate to be interconnected using the precision of the solder ball shaped bumps. For example, the solder ball shaped bump application is useful in chip scale packages (CSP) or in fine ball grid array (FBGA) packages. The in situ resistance heating strip allows for selecting which balls need to be transferred by selectively heating only those resistance heating strips 66.

The applications of providing interconnect and bump contacts are numerous. For example, the metal trace interconnect and the bump contact may be used in any type of semiconductor device such as a memory storage device. These memory storage devices can range from read-only memory (ROM) and random access memory (RAM) to exotic types of memory such as video memory and the memory used in computer systems. Additionally, the application of this metal trace interconnect and bump contact structure can be utilized in micro-processor packages that are used in computer systems as well as in other types of systems, and other types of single processing devices and support chips normally used in electronic devices. These electronic devices range from cellular phones to microwave systems, to automobiles and even programmable wrist watches.

Although the present invention has been described with reference to a particular embodiment, the invention is not limited to this described embodiment. The invention is limited only by the appended claims, which include within their scope all equivalent devices or methods which operate according to the principles of the invention as described.

What is claimed is:

1. A method for forming a mold for forming metal bumps on a secondary substrate, comprising:

applying a protective layer to a surface of a substrate mold;

masking said protective layer;

removing at least a portion of said protective layer forming at least one opening in said protective layer;

forming at least one cavity in said substrate mold through said at least one opening in said protective layer;

forming a non-stick protective layer in said at least one cavity; and forming at least one heating strip on another surface of the substrate mold.

2. The method according to claim 1, wherien said protective layer is a silicon oxide layer.

3. The method according to claim 1, wherein said protective layer is silicon nitride layer.

4. The method according to claim 1, wherein said non-stick protective layer prevents metal material from adhering to said at least one cavity.

5. The method according to claim 1, further comprising:

applying a metal paste to said substrate mold;

spreading said metal paste across said surface within said at least one cavity;

heating said substrate mold with said metal paste in said at least one cavity to a temperature sufficient enough to melt said metal paste; and sufficient enough to melt said metal paste; and removing said metal paste within said at least one cavity.

6. The method according to claim 5, further comprising:

applying said substrate mold to said secondary substrate;

using said heating for said melted solder paste to form a contact with said secondary substrate; and removing said secondary substrate from said substrate mold wherein said melted solder paste adheres to said secondary substrate and not to said at least one cavity.

7. The method according to claim 1, wherein the at least one cavity includes a trapezoidal shaped cavity.

8. The method according to claim 1, wherein the at least one cavity includes a hemispherical shaped cavity.

9. The method according to claim 1, wherein the at least one cavity includes a rectangular shaped cavity.

10. The method according to claim 1, wherein the at least one cavity includes a square shaped cavity.

11. The method according to claim 1, wherein the at least one heating strip includes a resistance heating strip.

12. The method according to claim 1, further comprising:

forming a plurality of heating strips on said another surface of the substrate mold.

13. The method according to claim 1, further comprising:

forming an electrical conductor having a portion connected to the at least one heating strip.

14. The method according to claim 12, further comprising:

forming an electrical conductor having a portion thereof connected to the plurality of heating strips.

15. A method for forming a mold for forming metal bumps on a secondary substrate, comprising:

applying a protective layer to a surface of a substrate mold;

masking said protective layer;

removing at least a portion of said protective layer forming at least one opening in said protective layer;

forming at least one cavity in said secondary substrate through said at least one opening in said protective layer;

forming a non-stick protective layer in said at least one cavity;

applying a metal paste to sid substrate mold;

spreading said metal paste across said surface within said at least one cavity;

heating said substrate mold with said metal paste in said at least one cavity to a temperature sufficient enough to melt said metal paste;

removing said metal paste within said at least one cavity; and forming at least one heating strip on another surface of the substrate mold.

16. The method according to claim 15, further comprising:

applying said substrate mold to said secondary substrate;

using said heating for said melted solder paste to form a contact wth said secondary substrate; and removing said secondary substrate from said substrate mold wherein said metal solder paste adheres to said secondary substrate and not tos aid at least one cavity.

17. The method according to claim 15, wherein the at least one cavity includes a trapezoidal shaped cavity.

18. The method according to claim 15, wherein the at least one cavity includes a hemispherical shaped cavity.

19. The method according to claim 15, wherein the at least one cavity includes a rectangular shaped cavity.

20. The method according to claim 15, wherein the at least one heating strip includes a resistance heating strip.

21. The method according to claim 15, further comprising:

forming a plurality of heating strips on said another surface of the substrate mold.

22. The method according to claim 15, further comprising:

forming an electrical conductor having a portion connected to the at least one heating strip.

23. The method according to claim 21, further comprising:

forming an electrical conductor having a portion thereof connected to the plurality of heating strips.

* * * * *

UNITED STATES PATENT AND TRADEMARK OFFICE
CERTIFICATE OF CORRECTION

PATENT NO. : 6,295,730 B1
DATED : October 2, 2001
INVENTOR(S) : Salman Akram

It is certified that error appears in the above-identified patent and that said Letters Patent is hereby corrected as shown below:

Drawings,
FIG. 7, change the left-most and right-most occcurrences of "24" to -- 26 --
Replace FIG. 7 with the attached new FIG. 7.

Column 1,
Line 44, change "stenoid" to -- stencil --.
Line 45, delete the comma after "removal"

Column 2,
Line 4, change "to" to -- too --
Line 9, before "ball" change "the" to -- a --
Line 14, after "diameter" and before "than" insert -- to connect to either of the two structures since the adjacent acceptable preformed solder balls are larger in diameter --
Line 21, after "Device'" and before the comma insert -- (the '831 Patent) --
Line 41, after "Device'" and before the comma insert -- (the '099 Patent) --

Column 3,
Line 15, change "ball-shapes" to -- ball shapes --

Column 4,
Line 14, after "substrate" and before "of" insert --mold --
Line 49, after "14" and before "may" insert -- serves to protect the surface of substrate mold 10 when a subsequent etch is performed to make the cavities or apertures in the flat, planar upper surface 12. First protective mask layer 14 --
Line 66, change "etching" to -- etch --

Column 5,
Line 17, change "result in" to -- resulting --
Line 33, change "frustroconically-shaped" to -- frustoconically-shaped --
Line 38, change "lead-tin—indium," to -- lead-tin-indium, --
Line 65, change "trapazoidal" to -- trapezoidal --
Line 66, change "pastes" to -- paste, --

Column 6,
Line 25, after "the" delete "of"
Line 41, after "bumps" and before "be" insert -- to --
Line 49, after "heated" and before "a" insert -- to --

UNITED STATES PATENT AND TRADEMARK OFFICE
CERTIFICATE OF CORRECTION

PATENT NO. : 6,295,730 B1
DATED : October 2, 2001
INVENTOR(S) : Salman Akram

It is certified that error appears in the above-identified patent and that said Letters Patent is hereby corrected as shown below:

Column 7,
Line 12, at the end of the line, insert a comma after "50"
Line 18, change "18" to -- 24 --
Line 24, before "carrier" delete "a"

Column 8,
Line 7, after "the" and before "substrate" insert -- carrier --
Line 17, change "connector" to -- electrical conductor --

Column 9,
Line 29, before "removing" delete "sufficient enough to melt said metal paste; and"

Column 10,
Line 15, change "aid" to -- said --
Line 32, change "tos aid" to -- to said --

Signed and Sealed this

Fourteenth Day of December, 2004

JON W. DUDAS
*Director of the United States Patent and Trademark Office*